(12) United States Patent
Tasaka

(10) Patent No.: US 8,531,233 B2
(45) Date of Patent: Sep. 10, 2013

(54) SWITCHING CIRCUIT INCLUDING NITRIDE SEMICONDUCTOR DEVICES

(75) Inventor: Yasushi Tasaka, Niiza (JP)

(73) Assignee: Sanken Electric Co., Ltd., Niiza-shi (JP)

(*) Notice: Subject to any disclaimer, the term of this patent is extended or adjusted under 35 U.S.C. 154(b) by 12 days.

(21) Appl. No.: 13/437,316

(22) Filed: Apr. 2, 2012

(65) Prior Publication Data

US 2012/0248565 A1 Oct. 4, 2012

(30) Foreign Application Priority Data

Apr. 4, 2011 (JP) ................................. 2011-082650

(51) Int. Cl.
*H03K 17/687* (2006.01)
(52) U.S. Cl.
USPC ........... 327/427; 327/108; 327/109; 327/110; 327/111
(58) Field of Classification Search
USPC .......................................... 327/427, 108–111
See application file for complete search history.

(56) References Cited

U.S. PATENT DOCUMENTS

| | | | | |
|---|---|---|---|---|
| 7,999,365 B2* | 8/2011 | Hu et al. | ........................ | 257/676 |
| 8,054,110 B2* | 11/2011 | Wang et al. | ................... | 327/109 |
| 8,456,201 B2* | 6/2013 | Olivo | ............................ | 327/110 |
| 2007/0235768 A1* | 10/2007 | Nakazawa et al. | ............ | 257/211 |
| 2008/0136390 A1* | 6/2008 | Briere | ........................... | 323/282 |
| 2011/0095736 A1* | 4/2011 | Briere | ........................... | 323/271 |
| 2012/0056648 A1* | 3/2012 | Iwabuchi et al. | ............. | 327/109 |
| 2012/0248565 A1* | 10/2012 | Tasaka | .......................... | 257/472 |
| 2013/0009676 A1* | 1/2013 | Morita et al. | ................. | 327/109 |
| 2013/0015886 A1* | 1/2013 | Johnson | ........................ | 327/109 |

FOREIGN PATENT DOCUMENTS

JP 2008-187167 8/2008

* cited by examiner

*Primary Examiner* — Adam Houston
(74) *Attorney, Agent, or Firm* — Oblon, Spivak, McClelland, Maier & Neustadt, L.L.P.

(57) ABSTRACT

A switching circuit includes a switching device including the first and second main electrodes and a control electrode; and a driver including: a first rectifying device having an anode terminal connected to the first main electrode of the switching device; a first driving device having a first main electrode connected to a cathode terminal of the first rectifying device and a second main electrode connected to the control electrode of the switching device; a second driving device having a first main electrode connected to the control electrode of the switching device and a second main electrode connected to the second main electrode of the switching device; and input terminals receiving control signals inputted to a control electrode of the first driving device and a control electrode of the second driving device.

5 Claims, 9 Drawing Sheets

SWITCHING CIRCUIT INCLUDING NITRIDE SEMICONDUCTOR DEVICES

CROSS REFERENCE TO RELATED APPLICATIONS AND INCORPORATION BY REFERENCE

This application is based upon and claims the benefit of priority from prior Japanese Patent Application P2011-082650 filed on Apr. 4, 2011; the entire contents of which are incorporated by reference herein.

BACKGROUND OF THE INVENTION

1. Field of the Invention

The present invention relates to a switching circuit including a switching device having a nitride semiconductor layer.

2. Description of the Related Art

For example, high-frequency devices, high voltage power devices, and the like include electric field effect transistors each including a nitride semiconductor layer having a layered structure of gallium nitride (GaN) and aluminum gallium nitride (AlGaN) or the like (hereinafter, referred to as nitride FETs). Various types of integrated circuits have been proposed using nitride FETs each including a gate electrode which is provided on a nitride semiconductor layer and forms a Schottky barrier junction (hereinafter, referred to as a nitride-based Schottky gate FETs), nitride-based FETs having an MIS structure in which a gate electrode is provided on the nitride semiconductor layer with an insulating film interposed therebetween (hereinafter, referred to as a nitride-based MIS gate FETs), and the like.

In order to draw out the excellent operation characteristics of a nitride-based FET, it is necessary to sufficiently examine the configuration of a driver to drive the nitride-based FET. For example, nitride-based Schottky gate FETs have a problem of an increase in power consumption due to gate current flowing while the FETs are on. Nitride-based MIS gate nitride FETs have large gate capacities and require large gate current for high-speed operation. Accordingly, drivers capable of solving such problems are desired.

SUMMARY OF THE INVENTION

An aspect of the present invention is a switching circuit comprising a switching device and a driver. The switching circuit includes first and second main electrodes provided with a distance from each other on a principal surface of a nitride semiconductor layer; and a control electrode provided between the first and second main electrodes on the principal surface. The driver includes a first rectifying device having an anode terminal connected to the first main electrode of the switching device; a first driving device having a first main electrode connected to a cathode terminal of the first rectifying device and a second main electrode connected to the control electrode of the switching device; a second driving device having a first main electrode connected to the control electrode of the switching device and a second main electrode connected to the second main electrode of the switching device; and input terminals receiving control signals inputted to a control electrode of the first driving device and a control electrode of the second driving device.

DETAILED DESCRIPTION OF THE INVENTION

Figure 1:
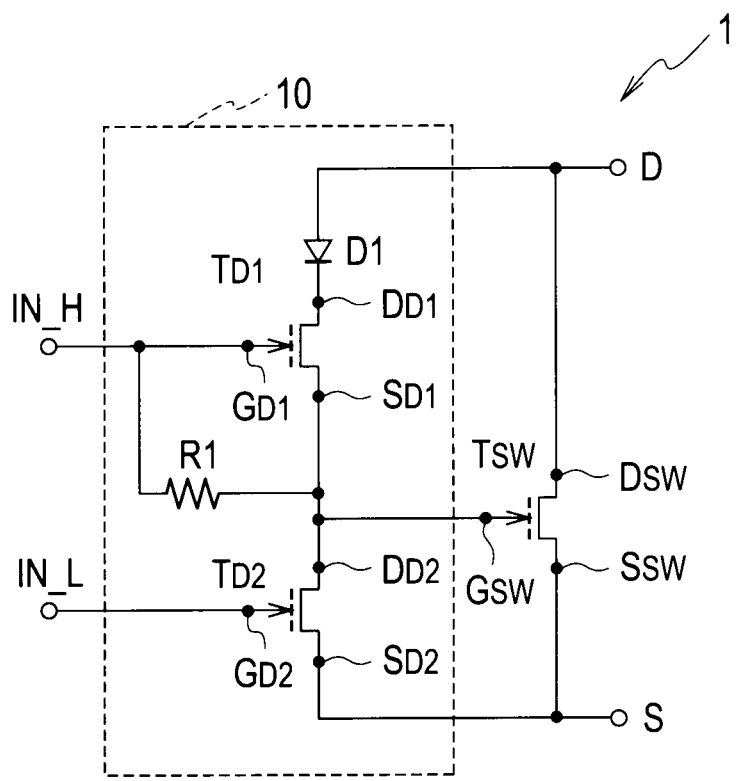
FIG. 1 is a schematic circuit diagram showing the configuration of a switching circuit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

(First Embodiment)

A switching circuit 1 according to a first embodiment of the present invention includes a switching device $T_{SW}$ and a driver 10 driving the switching device $T_{SW}$. The switching device $T_{SW}$ includes a drain electrode $D_{SW}$, a source electrode $S_{SW}$, and a gate electrode $G_{SW}$. The drain and source electrodes $D_{SW}$ and $S_{SW}$ are placed with a distance from each other on a principal surface of a nitride semiconductor layer. The gate electrode $G_{SW}$ is placed between the drain and source electrodes $D_{SW}$ and $S_{SW}$ on the principal surface of the nitride semiconductor layer. The drain and source electrodes $D_{SW}$ and $S_{SW}$ of the switching device $T_{SW}$ are connected to a drain terminal D and a source terminal S, respectively.

Figure 2:
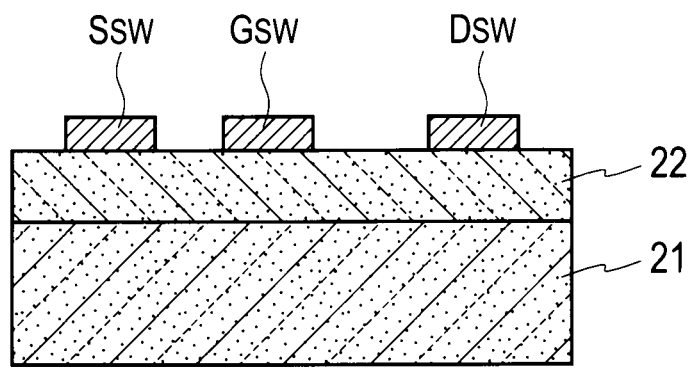
FIG. 2 is a schematic view showing an example of the structure of a switching device used in the switching circuit according to the first embodiment of the present invention.

The switching device $T_{SW}$ is a nitride-based FET including the nitride semiconductor layer having a layered structure of a GaN layer and an AlGaN layer, for example. FIG. 2 shows a structure example of the switching device $T_{SW}$. In the example of FIG. 2, the drain, source, and gate electrodes $D_{SW}$, $S_{SW}$, and $G_{SW}$ are arranged on a flat principal surface of a nitride semiconductor layer 22 provided on a substrate 21. The principal surface of the nitride semiconductor layer 22 may have a rough profile with recesses formed.

The driver 10 includes a first rectifying device D1 and first and second driving devices $T_{D1}$ and $T_{D2}$. As shown in FIG. 1, an anode terminal of the first rectifying device D1 is connected to the drain electrode $D_{SW}$ of the switching device $T_{SW}$, and a cathode terminal of the first rectifying device D1 is connected to a drain electrode $D_{D1}$, of the first driving device $T_{D1}$. A source electrode $S_{D1}$ of the first driving device $T_{D1}$ is connected to the gate electrode $G_{SW}$ of the switching device $T_{SW}$. A drain electrode $D_{D2}$ of the second driving device $T_{D2}$ is connected to the gate electrode $G_{SW}$ of the switching device $T_{SW}$, and a source electrode $S_{D2}$ thereof is connected to the source electrode $S_{SW}$ of the switching device $T_{SW}$.

A gate electrode $G_{D1}$ of the first driving device $T_{D1}$ is connected to an input terminal IN_H, and a gate electrode $G_{D2}$ of the second driving element $T_{D2}$ is connected to an input terminal IN_L. The input terminals IN_H and IN_L receive control signals to control on/off of the switching device $T_{SW}$. Between the input terminal IN_H and the gate electrode $G_{SW}$ of the switching device $T_{SW}$, a gate resistor R1 is connected.

In the switching circuit 1, a control signal to control on/off of the first driving device $T_{D1}$ is inputted to the gate electrode $G_{D1}$ of the first driving device $T_{D1}$ through the input terminal IN_H. A control signal to control on/off of the second driving device $T_{D2}$ is inputted to the gate electrode $G_{D2}$ of the second driving device $T_{D2}$ through the input terminal IN_L. The conducting states of the first and second devices $T_{D1}$ and $T_{D2}$ are set by the control signals inputted to the driver 10 in order to control on/off of the switching device $T_{SW}$. Moreover, the first rectifying device D1 prevents current from flowing from the gate electrode $G_{D1}$ of the first driving element $T_{D1}$ to the drain terminal D. Similarly, the first rectifying device D1 prevents current from flowing from the source electrode $S_{D1}$ of the first driving device $T_{D1}$ to the drain terminal D.

Preferably, the first and second driving devices $T_{D1}$ and $T_{D2}$ are nitride-based FETs similarly to the switching device $T_{SW}$. Employing nitride-based FETs operable at high speed as the first and second driving devices $T_{D1}$ and $T_{D2}$ allows for high-speed operation of the entire switching circuit 1. For example, it is effective that the switching device $T_{SW}$ and driver 10 are formed in a same semiconductor chip. The first rectifying device D1 can be also formed in the semiconductor chip as a diode including a nitride semiconductor layer. For example, as the first rectifying device D1, a Schottky barrier diode can be formed by using a nickel (Ni) film, and a diode can be formed by short-circuiting the gate and the source of the FET structure shown in FIG. 2.

The first and second driving devices $T_{D1}$ and $T_{D2}$ need to have driving capabilities at least high enough to control the operation of the switching device $T_{SW}$. Accordingly, the sizes of the first and second driving devices $T_{D1}$ and $T_{D2}$ may be smaller than that of the switching device $T_{SW}$.

Figure 3:
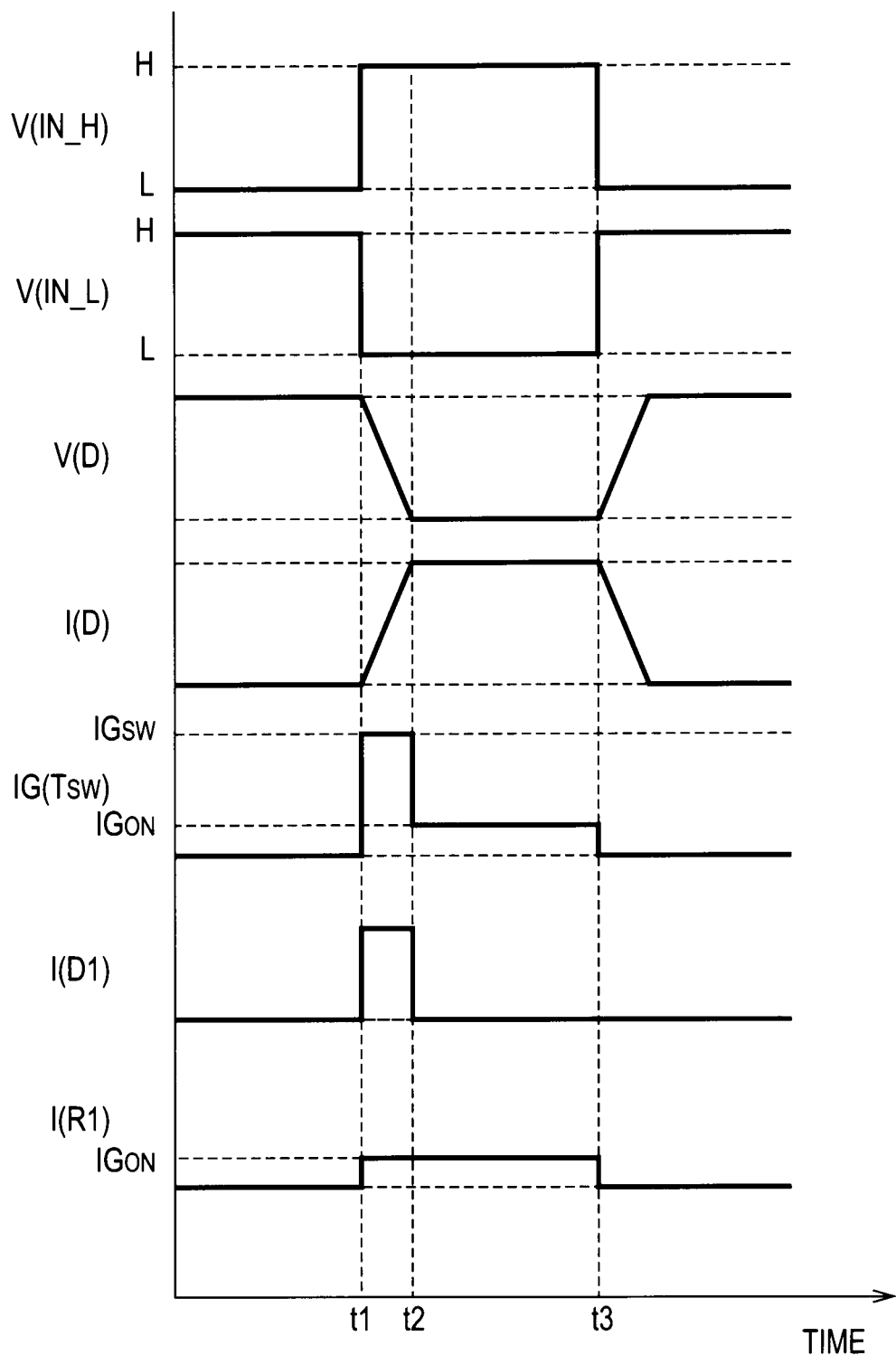
FIG. 3 is a timing diagram for explaining the operation of the switching circuit according to the first embodiment of the present invention.

With reference to the timing diagram of FIG. 3, the operation of the switching circuit 1 is described below. In FIG. 3, input voltage V(IN_H) refers to a voltage level of a signal inputted to the input terminal IN_H, and input voltage V(IN_L) refers to a voltage level of a signal inputted to the input terminal IN_L. Drain voltage V(D) refers to voltage of the drain terminal D, and drain current I(D) refers to current flowing through the drain terminal D. Gate current $IG(T_{SW})$ refers to gate current of the switching device $T_{SW}$. Rectifying current I(D1) and gate resistor current I(R1) refer to current flowing through the first rectifying device D1 and current flowing through the gate resistor R1, respectively.

If high and low signals are inputted into the input terminals IN_H and IN_L at time t1, respectively, the first driving device $T_{D1}$ is turned on while the second driving device $T_{D2}$ is turned off. The gate current $IG(T_{SW})$ of the gate current $IG_{SW}$ large enough to turn on the switching device $T_{SW}$ therefore flows to the gate electrode $G_{SW}$ of the switching device $T_{SW}$ through the first rectifying device D1 and the first driving device $T_{D1}$. The switching device $T_{SW}$ is then turned on. At this time, the gate resistor current I(R1) also flows to the gate electrode $G_{SW}$ of the switching element $T_{SW}$.

After the switching device $T_{SW}$ is turned on, the drain voltage V(D) gradually drops. The first driving device $T_{D1}$ is therefore turned off at time t2, thus stopping the current flowing through the first rectifying device D1. The gate current $IG(T_{SW})$ is therefore rapidly reduced. Accordingly, the gate current $IG(T_{SW})$ having a gate current value $IG_{ON}$ which is large enough to keep the switching device $T_{SW}$ on flows to the gate electrode $G_{SW}$ of the switching device $T_{SW}$ through the gate resistor R1.

If low and high signals are inputted to the input terminals IN_H and IN_L at time t3, respectively, the second driving device $T_{D2}$ is turned on while the first driving device $T_{D1}$ remains off. The switching device $T_{SW}$ is therefore turned off.

As described above, in the switching circuit 1 shown in FIG. 1, large current is allowed to flow from the first driving device $T_{D1}$ to the gate electrode $G_{SW}$ of the switching device $T_{SW}$ only at the start of switching operation requiring gate charge for turning on the switching device $T_{SW}$. After the first driving device $T_{D1}$ becomes the non-conducting state, the minimum gate current needed to keep the switching device $T_{SW}$ on is supplied to the gate electrode $G_{SW}$ of the switching device $T_{SW}$ through the gate resistor R1. According to the switching circuit 1, it is possible to efficiently drive the switching device $T_{SW}$ at high speed operation while preventing an increase in power consumption.

The resistance value of the gate resistor R1 is set in the light of the size of the switching device $T_{SW}$, the voltage level of the high signal inputted to the input terminal IN_H, and the like so that the gate current $IG(T_{SW})$ has a current value needed to keep the on state of the switching device $T_{SW}$.

When the switching device $T_{SW}$ is a nitride-based Schottky gate FET, the switching device $T_{SW}$ has a device structure similar to a junction field effect transistor (JFET) in which gate current flows to a gate electrode. In order to cause the switching device $T_{SW}$ to operate at high speed, therefore, it is necessary to apply high voltage to the gate electrode $G_{SW}$. Implementation of high speed operation increases the gate current. On the other hand, if the gate current to be supplied is reduced, the switching operation slows down.

Accordingly, the switching circuit 1, which requires large current only during the switching operation of the switching device $T_{SW}$ and is supplied with minimum current needed to keep the on state of the switching device $T_{SW}$ while the switching device $T_{SW}$ is on, is an ideal switching circuit.

Moreover, the nitride-based FETs are capable of operating at higher speed than devices by silicon (Si) process technology such as bipolar transistors, MOSFETs, and insulated gate bipolar transistors (IGBTs). For maximizing the performance thereof, it is preferable that the gate resistance inserted in the driver for preventing oscillation be set to 0 or minimized. It is therefore necessary to reduce parasitic inductance of the gate electrode which causes the oscillation. Furthermore, threshold voltage Vth of nitride-based FETs is lower than that of silicon-based MOSFETs. It is therefore preferable that the parasitic inductance be reduced also for the purpose of preventing malfunction.

For the reduction of the parasitic inductance, the switching circuit 1, which allows the switching device $T_{SW}$ and the driver 10 to be easily integrated into a single chip, is effective. The driver 10 of the switching circuit 1 can be composed of the first and second driving devices $T_{D1}$ and $T_{D2}$ of nitride-based FETs and the first rectifying device D1 formed using the nitride semiconductor layer, and the gate resistor R1. Accordingly, the driver 10 can be formed by the process to manufacture the nitride semiconductor device forming the switching device $T_{SW}$ without another additional process. Furthermore, a general nitride-based FET has a horizontal FET structure with a chip's back side set to the source potential. The switching device $T_{SW}$ and the driver 10 can be therefore easily formed in a same semiconductor chip.

By integrating the switching device $T_{SW}$ and driver 10 into a single chip, wire can be eliminated from the gate wiring, and the circuit can be composed of only metal wiring. This can reduce the parasitic inductance. Accordingly, the gate resistance R1 can be reduced without causing oscillation, thus allowing for high speed operation of the switching device $T_{SW}$. Moreover, since the driver 10 is composed of a nitride-based FET, the high speed operation performance of the switching device $T_{SW}$ can be sufficiently exerted.

Furthermore, since the switching circuit 1 is formed in a single chip, the switching device $T_{SW}$ and the first driving device $T_{D1}$ can share the drain terminal. Accordingly, compared with the case where the switching device $T_{SW}$ and the first driving device $T_{D1}$ are provided with different drain terminals, the number of pins of a package of the switching circuit 1 can be reduced. Moreover, sharing the pad of the drain terminal by the switching device $T_{SW}$ and the first driving device $T_{D1}$ has effects on reduction of the chip area, the number of wires, and the package size.

Moreover, short-circuiting the source terminals of the switching device $T_{SW}$ and the second driving device $T_{D2}$ stabilizes the gate voltage of the switching device $T_{SW}$, thus stabilizing the switching operation of the switching circuit 1.

Furthermore, since the gate terminal of the switching device $T_{SW}$ and the drain terminal of the second driving device $T_{D2}$ are shorted, the switching device $T_{SW}$ allows current to flow from the source terminal to the drain terminal when the second driving device $T_{D2}$ is on. This eliminates the need for a regenerative diode.

As described above, according to the switching circuit 1 according to the first embodiment of the present invention, the switching device $T_{SW}$ is supplied with the amount of gate current needed by the switching operation only at the start of the switching operation and is supplied with the minimum gate current needed to keep the on state after the switching operation. According to the switching circuit 1, it is therefore possible to provide a switching circuit capable of operating at high speed with reduced gate current.

<First Modification>

Figure 4:
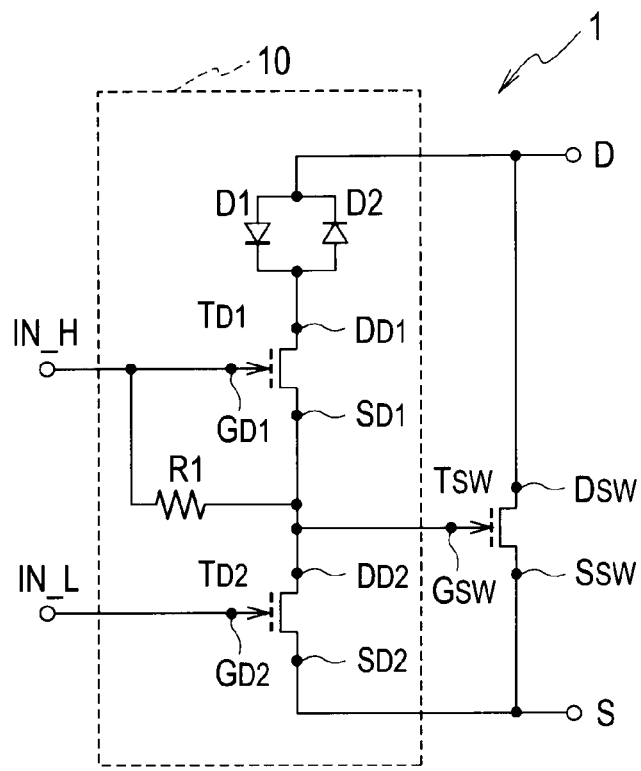
FIG. 4 is a schematic circuit diagram showing the configuration of a switching circuit according to a first modification of the first embodiment of the present invention.

FIG. 4 shows a switching circuit 1 according to a first modification of the first embodiment of the present invention. The switching circuit 1 shown in FIG. 4 further includes a second rectifying device D2 with the cathode terminal connected to the anode terminal of the first rectifying device D1 and the anode terminal connected to the cathode terminal of the first rectifying device D1.

While the switching device $T_{SW}$ is on, voltage across the input terminal IN_H and the drain terminal D is equal to the sum of forward voltage across the gate electrode $G_{D1}$ and the drain electrode $D_{D1}$ of the first driving device $T_{D1}$ and the forward voltage of the second rectifying device D2, that is, double the forward voltage Vf. On the other hand, voltage across the input terminal IN_H and the source terminal S is equal to the sum of forward voltage across the gate electrode $G_{D1}$ and the source electrode $S_{D1}$ of the first driving device $T_{D1}$ and the forward voltage across the gate electrode $G_{SW}$ and the source electrode $S_{SW}$ of the switching device $T_{SW}$, that is, double the forward voltage Vf.

Because of a voltage drop between the drain terminal ID and source terminal S, the voltage across the input terminal IN_H and the source terminal S is slightly higher than the voltage across the input terminal IN_H and the drain terminal D. Accordingly, the amount of gate current needed to keep the on state of the switching device $T_{SW}$ is supplied to the gate electrode $G_{SW}$. On the other hand, current unnecessary to keep the on state of the switching device $T_{SW}$ flows from the input terminal IN_H to the drain terminal D through the second rectifying device D2. According to the switching circuit 1 shown in FIG. 4, the minimum gate current needed to keep the on state of the switching device $T_{SW}$ is supplied to the switching device $T_{SW}$, and the voltage across the gate electrode $G_{SW}$ and the source electrode $S_{SW}$ of the switching device $T_{SW}$ is optimized.

<Second Modification>

Figure 5:
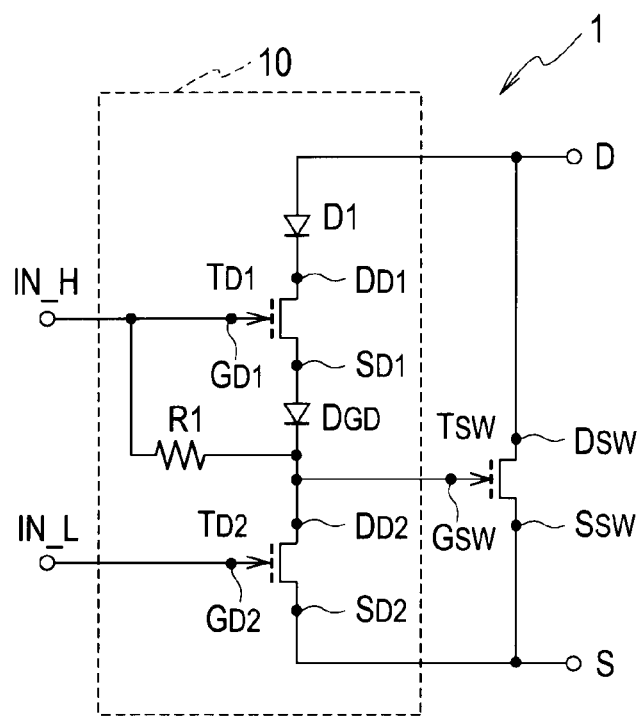
FIG. 5 is a schematic circuit diagram showing the configuration of a switching circuit according to a second modification of the first embodiment of the present invention.

FIG. 5 shows a switching circuit 1 according to a second modification of the first embodiment of the present invention. The switching circuit 1 shown in FIG. 5 further includes a protection rectifying device $D_{SD}$ with the anode terminal connected to the source electrode $S_{D1}$ of the first driving device $T_{D1}$ and the cathode terminal connected to the gate electrode $G_{SW}$ of the switching device $T_{SW}$.

The protection rectifying device $D_{GD}$ prevents the first rectifying device D1 and the first driving device $T_{D1}$ from being destroyed by excessive current. According to the switching circuit 1 shown in FIG. 5, the first rectifying device D1 and the first driving device $T_{D1}$ are protected from breakdown by current.

(Second Embodiment)

Figure 6:
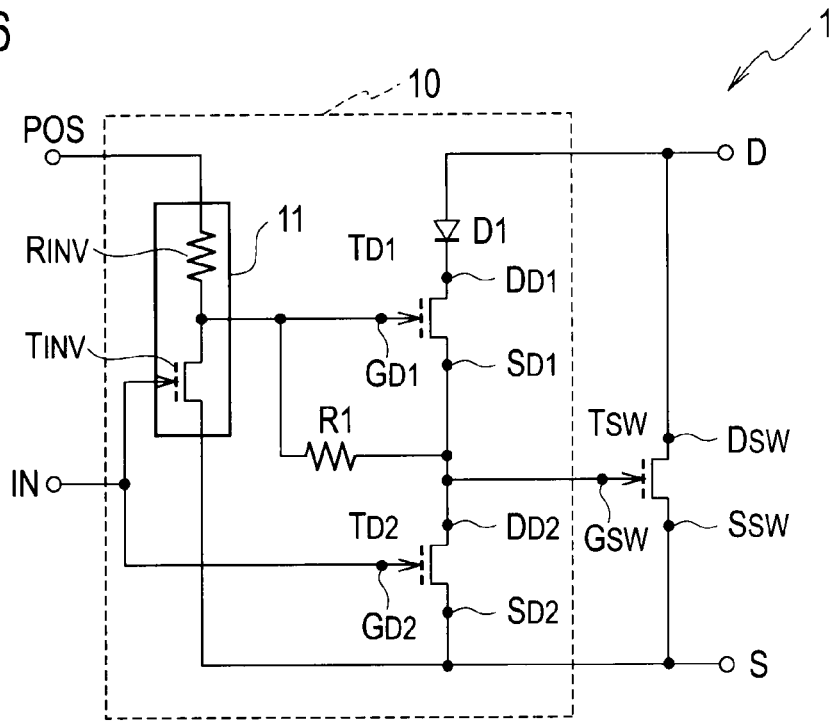
FIG. 6 is a schematic circuit diagram showing the configuration of a switching circuit according to a second embodiment of the present invention.

As shown in FIG. 6, a switching circuit 1 according to a second embodiment of the present invention further includes an inverter circuit 11 outputting to the gate electrode $G_{D1}$ of the first driving device $T_{D1}$ a signal having a phase opposite to a signal inputted to the gate electrode $G_{D2}$ of the second driving device $T_{D2}$.

The switching circuit 1 according to the second embodiment differs from that shown in FIG. 1 in that the gate electrode $G_{D1}$ of the first driving device $T_{D1}$ is connected to the output of the inverter circuit 11 instead of the input terminal IN_H, and the input of the inverter circuit 11 and the gate electrode $G_{D2}$ of the second driving device $T_{D2}$ are connected to the input terminal IN. The other configuration of the second embodiment is the same as that of the first embodiment.

As shown in FIG. 6, the inverter circuit 11 includes a resistor $R_{INV}$ and a transistor $T_{INV}$. The transistor $T_{INV}$ can be composed of a nitride-based FET. One terminal of the resistor $R_{INV}$ is connected to a power supply terminal POS, and the other terminal thereof is connected to the drain electrode of the transistor $T_{INV}$. The gate electrode of the transistor $T_{INV}$ is connected to the input terminal IN, and the drain electrode of the transistor $T_{INV}$ is connected to the gate electrode $G_{D1}$ of the first driving device $T_{D1}$. The source electrode of the transistor $T_{INV}$ is connected to the source terminal S. The power supply terminal POS is supplied with power supply voltage high enough to operate the inverter circuit 11. Accordingly, the input terminal of the inverter circuit 11 is the gate electrode of the transistor $T_{INV}$, and the output terminal of the inverter circuit 11 is the drain electrode of the transistor $T_{INV}$.

If a low signal is inputted to the input terminal IN, the second driving device $T_{D2}$ is turned off. On the other hand, the low signal inputted into the input terminal IN is inverted to a high signal, which is then inputted to the gate electrode $G_{D1}$ of the first driving device $T_{D1}$. The switching device $T_{SW}$ is therefore turned on. Similar to the operation described with reference to FIG. 3, when a high signal is inputted to the input terminal IN after the first driving device $T_{D1}$ is turned off to reduce the gate current $IG(T_{SW})$, the second driving device $T_{D2}$ is turned on, and the switching device $T_{SW}$ is turned off.

According to the switching circuit 1 shown in FIG. 6, controlling on/off of the switching device $T_{SW}$ requires only one terminal to input the control signal. Accordingly, the control of the switching device $T_{SW}$ is easier than the switching circuit 1 shown in FIG. 1.

In the switching circuit 1, flow-through current flowing through the first and second driving devices $T_{D1}$ and $T_{D2}$ does not flow when the switching device $T_{SW}$ changes from on to off or from off to on. Accordingly, even if the inverter circuit 11 is employed, it is not necessary to set dead time for preventing flow-through current.

According to the switching circuit 1 according to the second embodiment, it is possible to provide a switching circuit which allows for easy input of the control signal and is capable of operating at high speed with the gate current reduced. The other is substantially the same as that of the first embodiment, and the overlapping description is omitted.

<Modification>

Figure 7:
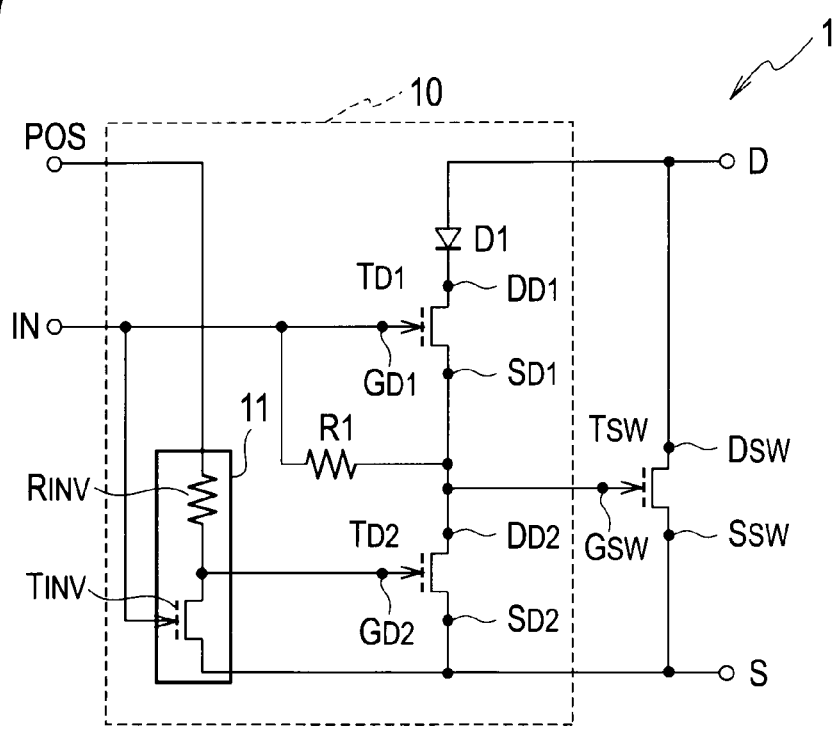
FIG. 7 is a schematic circuit diagram showing the configuration of a switching circuit according to a modification of the second embodiment of the present invention.

FIG. 7 shows a switching circuit 1 according to a modification of the second embodiment of the present invention. In the switching circuit 1 shown in FIG. 7, the inverter circuit 11 composed of the resistor $R_{INV}$ and transistor $T_{INV}$ outputs to the gate electrode $G_{D2}$ of the second driving device $T_{D2}$, a signal having a phase opposite to the signal inputted to the gate electrode $G_{D1}$ of the first driving device $T_{D1}$. Therefore, the input terminal IN is connected to the gate electrode $G_{D1}$ of the first driving device $T_{D1}$ and the input of the inverter 11, and the output of the inverter 11 is connected to the gate electrode $G_{D2}$ of the second driving device $T_{D2}$. In other words, the gate electrode of the transistor $T_{INV}$ is connected to the input terminal IN, and the drain electrode of the transistor $T_{INV}$ is connected to the gate electrode $G_{D2}$ of the second driving device $T_{D2}$.

If a high signal is inputted to the input terminal IN, the first driving device $T_{D1}$ is turned on. On the other hand, the high signal inputted to the input terminal IN is inverted to a low signal, which is then inputted to the gate electrode $G_{D2}$ of the second driving device $T_{D2}$. The switching device $T_{SW}$ is therefore turned on. Similar to the operation described with reference to FIG. 3, when a low signal is inputted to the input terminal IN after the first driving device $T_{D1}$ is turned off to reduce the gate current $IG(T_{SW})$, the second driving device $T_{D2}$ is turned on, and the switching device $T_{SW}$ is turned off.

In the switching circuit 1 shown in FIG. 7, at the change of the switching device $T_{SW}$ from off to on, the first driving device $T_{D1}$ can be turned on earlier than the second driving device $T_{D2}$ is turned off, thus causing flow-through current to flow through the first and second driving devices $T_{D1}$ and $T_{D2}$. However, the switching device $T_{SW}$ is turned on immediately after the first driving device $T_{D1}$ is turned on. The drain voltage V(D) therefore drops to turn off the first driving device $T_{D1}$. Accordingly, the flow-through current cannot become large enough to destroy the first and second driving devices $T_{D1}$ and $T_{D2}$.

(Third Embodiment)

Figure 8:
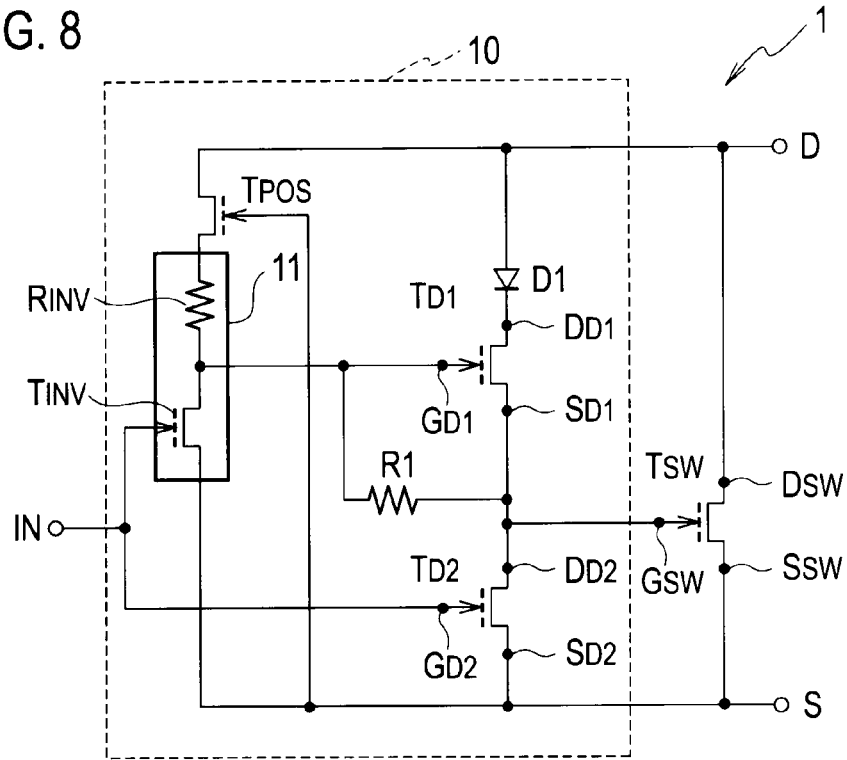
FIG. 8 is a schematic circuit diagram showing the configuration of a switching circuit according to a third embodiment of the present invention.

As shown in FIG. 8, a switching circuit 1 according to the third embodiment of the present invention differs from the second embodiment shown in FIG. 6 in that the drain terminal ID serves as the power supply terminal POS. In the switching circuit 1 shown in FIG. 8, a transistor $T_{POS}$ is provided between the drain terminal D and the resistor $R_{INV}$ of the inverter circuit 11. The drain electrode of the transistor $T_{POS}$ is connected to the drain terminal D, and the source electrode thereof is connected to the resistor $R_{INV}$. The gate electrode of the transistor $T_{POS}$ is connected to the source terminal S. The other configuration is the same as that of the switching circuit 1 shown in FIG. 6.

The transistor $T_{POS}$ is composed of a normally-on nitride-based FET. By connecting the gate electrode of the transistor TPOS to the source terminal S, the voltage of the source electrode of the transistor $T_{POS}$ is set to threshold voltage Vth, thus supplying power to drive the inverter 11. The transistor $T_{POS}$ may be replaced with a diode, a resistor, or the like.

Figure 9:
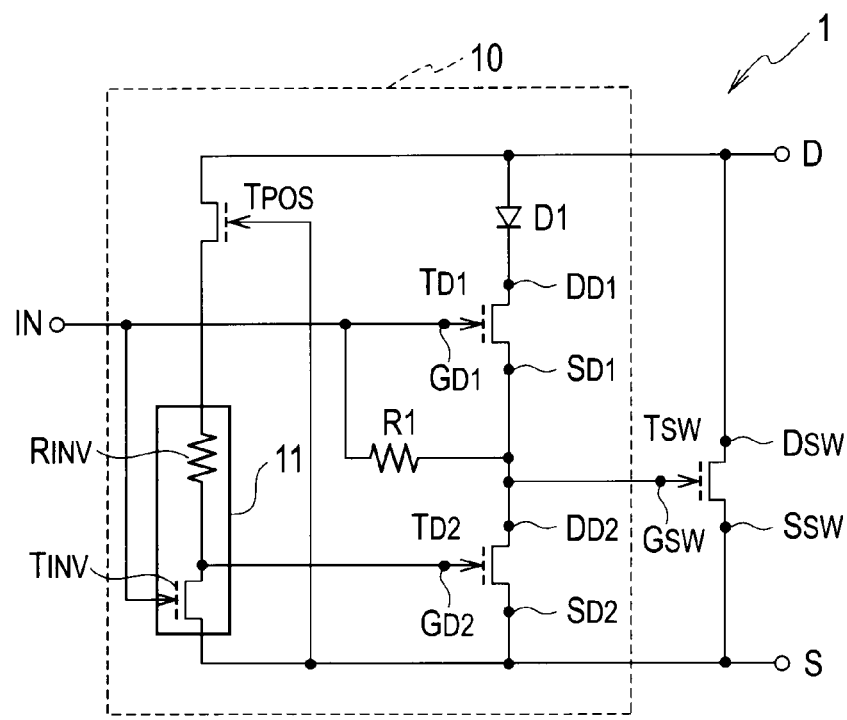
FIG. 9 is a schematic circuit diagram showing the configuration of a switching circuit according to a modification of the third embodiment of the present invention.

FIG. 9 shows a switching circuit 1 in which the drain terminal D serves as the power supply terminal POS in the modification of the second embodiment shown in FIG. 7 similar to the switching circuit 1 shown in FIG. 8.

According to the switching circuit 1 of the third embodiment, compared with the switching circuits 1 shown in FIGS. 6 and 7, the power supply terminal POS can be omitted, thus reducing the number of terminals. The other configuration is substantially the same as those of the first to second embodiments, and the overlapping description is omitted.

(Fourth Embodiment)

Figure 10:
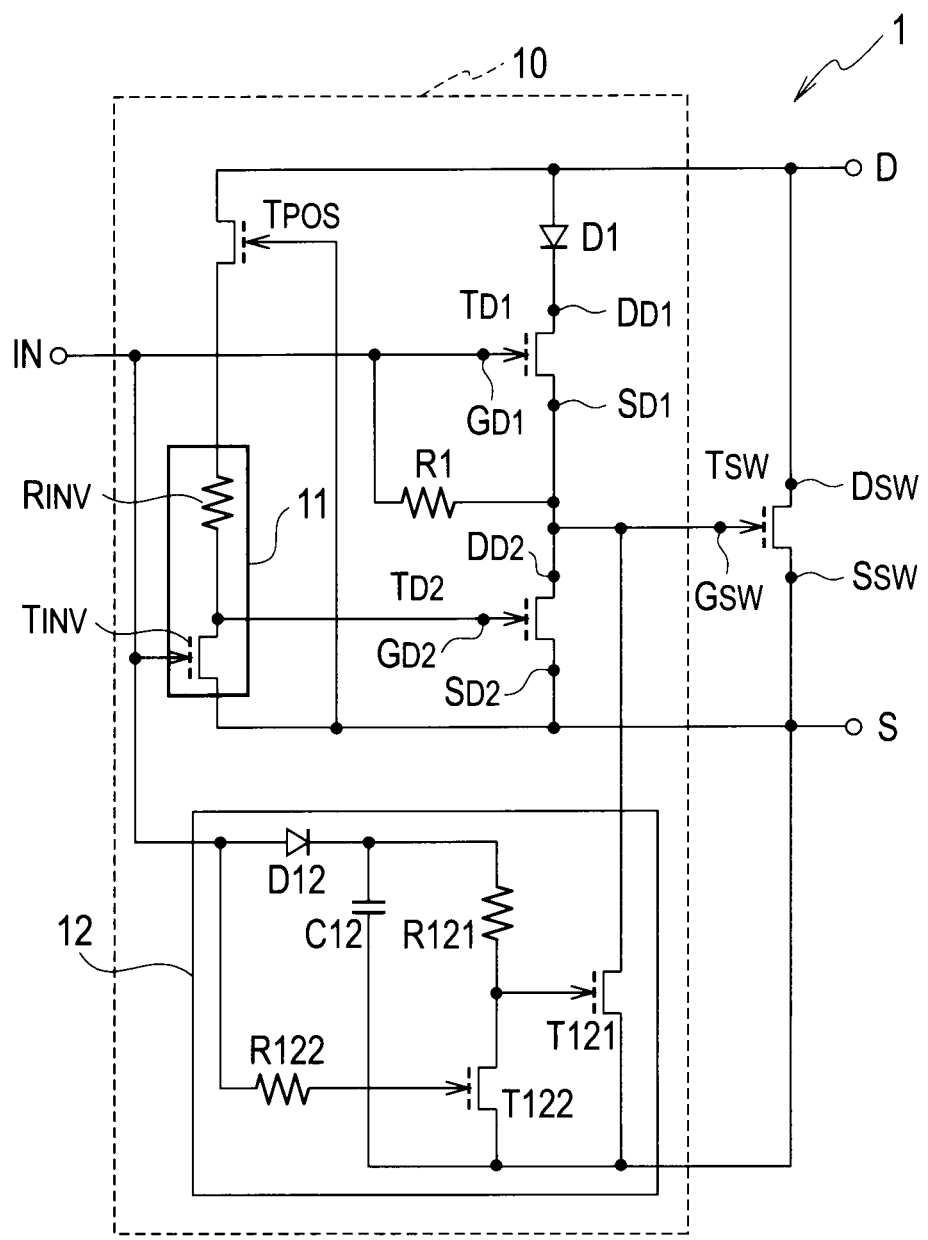
FIG. 10 is a schematic circuit diagram showing the configuration of a switching circuit according to a fourth embodiment of the present invention.

As shown in FIG. 10, a switching circuit 1 according to a fourth embodiment of the present invention is obtained by adding a controller 12 to the switching circuit 1 shown in FIG. 9. The controller 12 is a circuit to turn off the switching device $T_{SW}$ even in the case where the second driving device $T_{D2}$ is not turned on when a low signal is inputted to the input terminal IN in the switching circuit 1 shown in FIG. 9.

The controller 12 includes a diode D12, a capacitor C12, resistors R121 and R122, and transistors T121 and T122. The transistors T121 and 122 can be composed of nitride-based FETs.

The drain electrode of the transistor T121 is connected to the gate electrode $G_{SW}$ of the switching device $T_{SW}$; the source electrode thereof is connected to the source terminal S; and the gate electrode thereof is connected to the drain electrode of the transistor T122. The drain electrode of the transistor 122 is connected to one terminal of the resistor R121; the source electrode thereof is connected to the source terminal S; the gate electrode thereof is connected to the input terminal IN through the resistor R122. The other terminal of the resistor R121 is connected to the cathode terminal of the diode D12, and the anode terminal of the diode D12 is connected to the input terminal IN. The capacitor C12 is connected to between the cathode terminal of the diode D12 and the source terminal S.

In the switching circuit 1 shown in FIG. 9, when the switching device $T_{SW}$ is on, the drain voltage is 0 V, and the potential of the gate electrode $G_{D2}$ of the second driving device $T_{D2}$ is 0 V. When a low signal is inputted to the input terminal IN in order to turn off the switching device $T_{SW}$, therefore, there is a possibility that no gate current flows to the gate electrode $G_{D2}$ of the second driving device $T_{D2}$. Accordingly, the second driving device $T_{D2}$ is not turned on in some cases.

The controller 12 turns off the switching device $T_{SW}$ even in the case where the second driving device $T_{D2}$ is not turned on. Hereinafter, the operation of the controller 12 is described.

While a high signal is inputted to the input terminal IN, the transistor T122 is on, and the gate electrode of the transistor t121 is low. If a low signal is inputted to the input terminal IN, the transistor T122 is turned off, and the gate electrode of the transistor T121 becomes high level by electric charges charged in the capacitor C12. The switching device $T_{SW}$ starts to be turned off. When the switching device $T_{SW}$ starts to be turned off, the second driving device $T_{D2}$ is turned on, and then the switching device $T_{SW}$ is completely turned off.

According to the switching circuit 1 of the fourth embodiment, which includes the inverter circuit 11 outputting to the second driving device $T_{D2}$ the signal having a phase opposite to the input of the first driving device $T_{D1}$, the switching circuit 1 in which the drain terminal D serves as the power supply terminal POS can reliably turn off the switching device $T_{SW}$. The others are substantially the same as those of the first to third embodiments, and overlapping descriptions are omitted.

(Fifth Embodiment)

Figure 11:
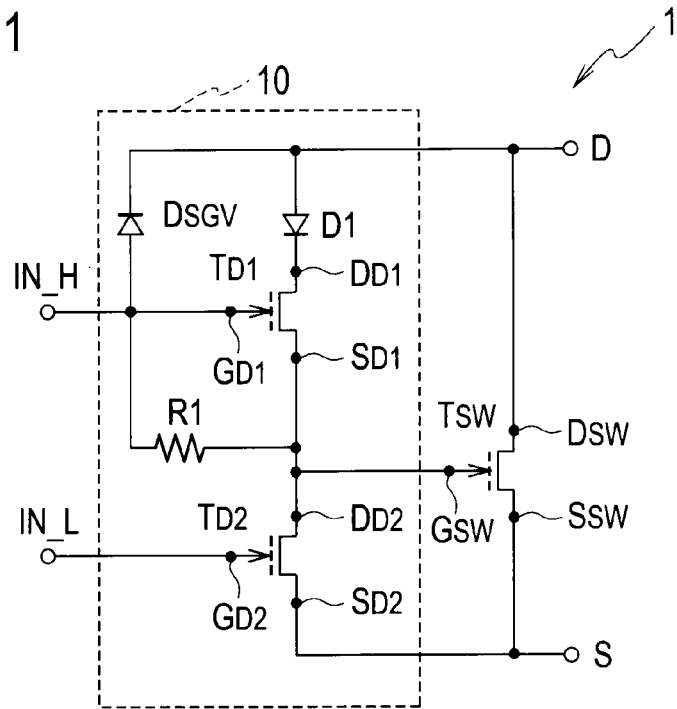
FIG. 11 is a schematic circuit diagram showing the configuration of a switching circuit according to a fifth embodiment of the present invention.

As shown in FIG. 11, a switching circuit 1 according to a fifth embodiment of the present invention differs from that shown in FIG. 1 in including a diode $D_{SGV}$ as a protection circuit against surge voltage inputted to the drain terminal D. The anode terminal of the diode $D_{SGV}$ for surge protection is connected to the gate electrode $G_{D1}$ of the first driving device $T_{D1}$, and the cathode terminal thereof is connected to the drain terminal D.

The diode $D_{SGV}$ can be a diode composed of a nitride semiconductor formed together with the driver 10 in a same semiconductor chip. Alternatively, the diode $D_{SGV}$ may be an external device. For example, the diode $D_{SGV}$ may be a single discrete device or may be provided within a drive IC outputting control signals to the input terminals IN_H and IN_L.

As previously described, the size of the switching device $T_{SW}$ is larger than that of the first driving device $T_{D1}$. The impedance of the first driving device $T_{D1}$ is therefore larger than that of the switching device $T_{SW}$. Accordingly, as shown in FIG. 11, the anode terminal of the diode $D_{SGV}$ is connected to the gate electrode $G_{D1}$ of the first driving device $T_{D1}$. The clamping operation is performed to turn on the first driving device $T_{D1}$ and turn on the second driving device $T_{D2}$ at breakdown of the diode $D_{SGV}$ even if the current flowing through the diode $D_{SGV}$ is small. The switching device $T_{SW}$ can be thus protected.

Figure 12:
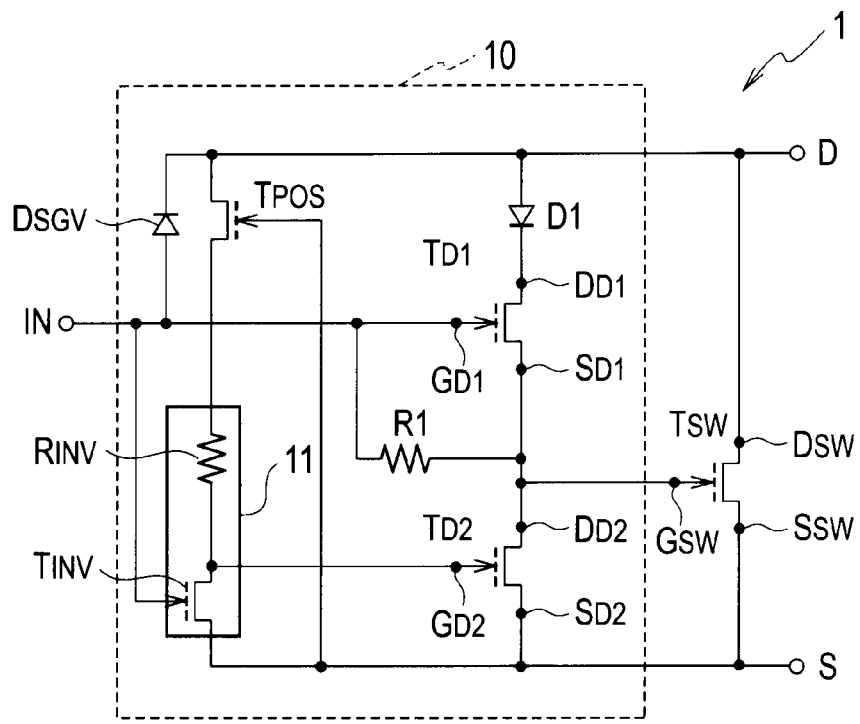
FIG. 12 is a schematic circuit diagram showing the configuration of a switching circuit according to a modification of the fifth embodiment of the present invention.

FIG. 12 shows a switching circuit 1 in which the diode $D_{SGV}$ for surge protection is connected to the switching circuit 1 shown in FIG. 9. In the switching circuit 1 shown in FIG. 12, similar to the switching circuit 1 shown in FIG. 11, the switching device $T_{SW}$ is protected from surge voltage.

Figure 13:
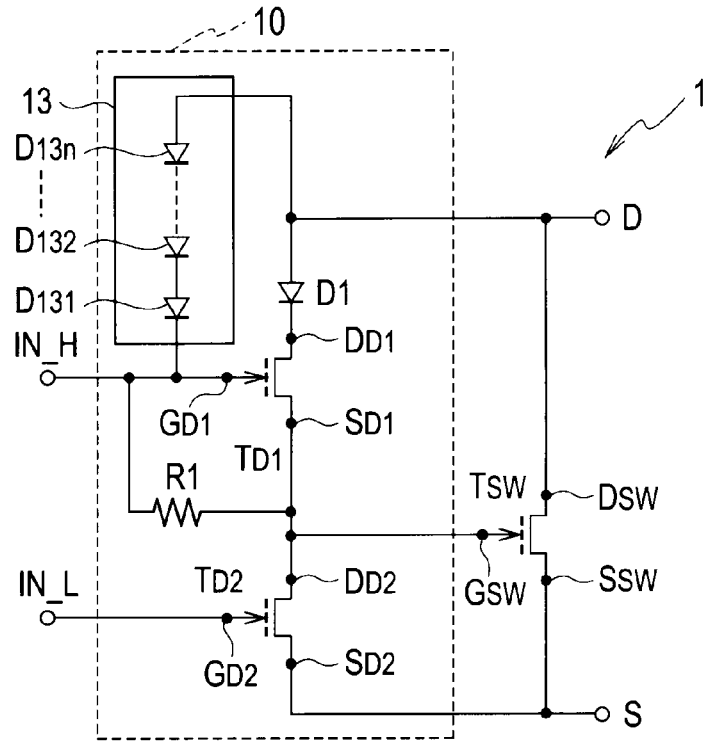
FIG. 13 is a schematic circuit diagram showing the configuration of a switching circuit according to another modification of the fifth embodiment of the present invention.

FIG. 13 shows an example in which the diode $D_{SGV}$ shown in FIG. 11 is replaced with a surge protection circuit 13 including a plurality of diodes D131, D132, . . . , and D13n connected in series in the forward direction (n: an integer not less than 2). Nitride semiconductor devices have low avalanche withstand capabilities. Accordingly, if the diode $D_{SGV}$ is composed of a nitride semiconductor device, the diode $D_{SGV}$ could be destroyed at breakdown. In the case where the diodes D131, D132, . . . , D13n are composed of nitride semiconductor devices, the diodes D131, D132, . . . , D13n are connected in series to be prevented from being destroyed at breakdown. The number of diodes connected in series is about 200, for example.

Figure 14:
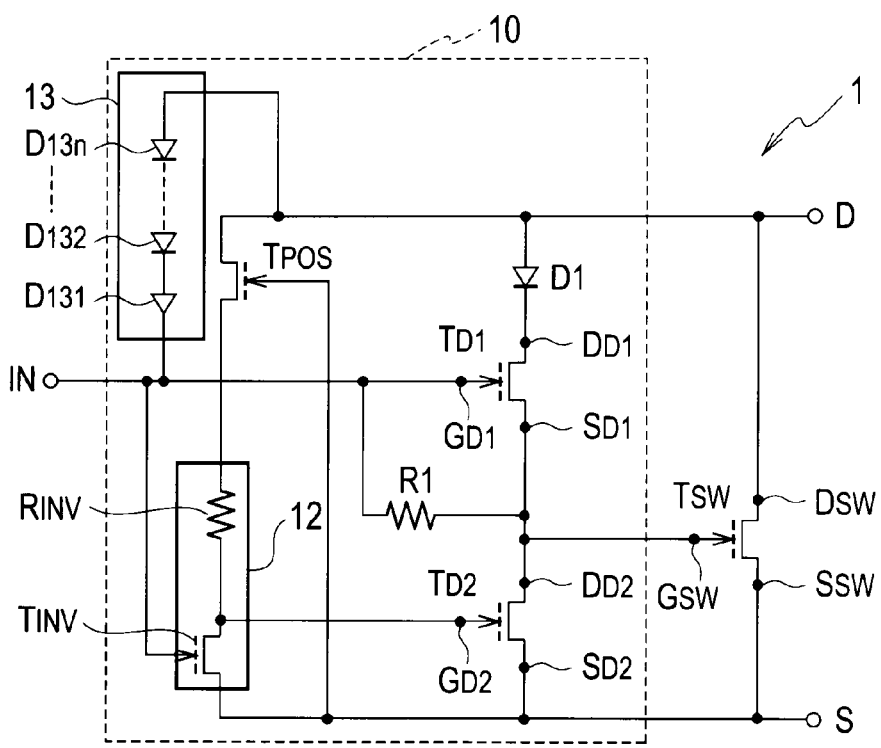
FIG. 14 is a schematic circuit diagram showing the configuration of a switching circuit according to still another modification of the fifth embodiment of the present invention.

FIG. 14 shows an example in which the diode $D_{SGV}$ in the switching circuit 1 shown in FIG. 12 is replaced with the surge protection circuit 13. In the switching circuit 1 shown in FIG. 14, it is possible to prevent the diodes from being destroyed at breakdown similar to the switching circuit 1 shown in FIG. 13.

According to the switching circuit 1 of the fifth embodiment, the switching device $T_{SW}$ can be prevented from being destroyed by surge voltage. The others are substantially the same as those of the first to fourth embodiments, and the overlapping description is omitted.

(Sixth Embodiment)

Figure 15:
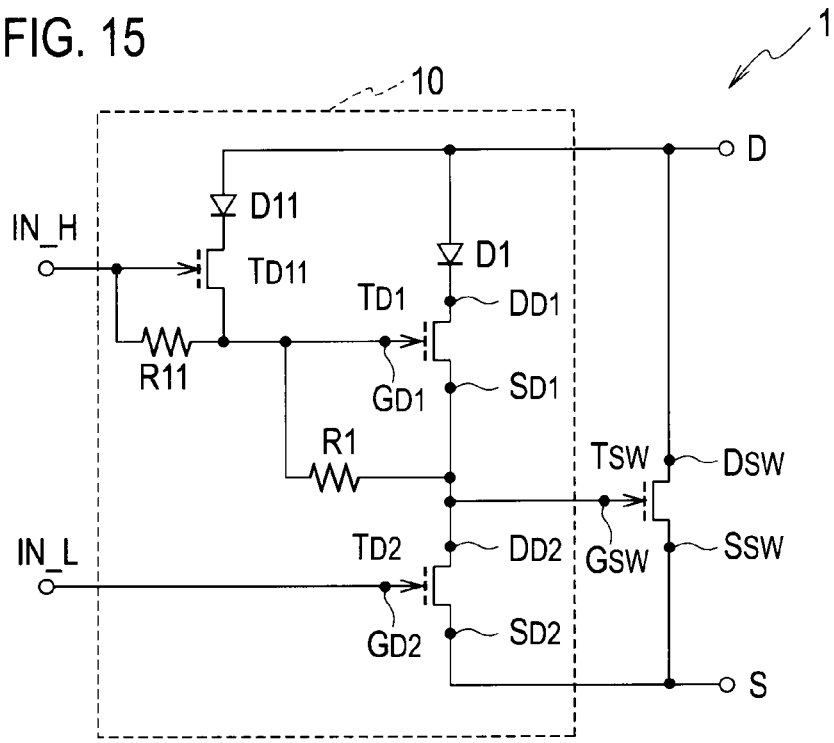
FIG. 15 is a schematic circuit diagram showing the configuration of a switching circuit according to a sixth embodiment of the present invention.

As shown in FIG. 15, a switching circuit 1 according to a sixth embodiment of the present invention differs from the switching circuit 1 shown in FIG. 1 in that a driving device turning on the switching device $T_{SW}$ is composed of a multistage transistor circuit. The other configurations are the same as those of the first embodiment shown in FIG. 1. FIG. 15 shows an example in which the multistage transistor circuit includes the first driving device $T_{D1}$ and the driving device $T_{D11}$ driving the first driving device $T_{D1}$. The driving device $T_{D11}$ can be composed of a nitride-based FET.

The drain electrode of the driving device $T_{D11}$ is connected to the cathode terminal of the diode D11; the gate electrode thereof is connected to the input terminal IN; and the source electrode thereof is connected to the gate electrode $G_{D1}$ of the first driving device $T_{D1}$. The anode terminal of the diode D11 is connected to the drain terminal D. Furthermore, a resistor R11 is connected between the gate electrode $G_{D1}$ of the first driving device $T_{D1}$ and the input terminal IN_H.

As previously described, the size of the first driving device $T_{D1}$ driving the switching device $T_{SW}$ can be made smaller than that of the switching device $T_{SW}$. Furthermore, driving the first driving device $T_{D1}$ with the driving device $TD_{11}$ smaller than the first driving device $T_{D1}$ can reduce the driving current. FIG. 15 shows an example where the multistage transistor circuit driving the switching device $T_{SW}$ is composed of two transistors, but the multistage transistor circuit may be composed of three or more transistors.

According to the switching circuit 1 of the sixth embodiment, it is possible to provide a switching circuit capable of operating at high speed with the driving current reduced and the gate current reduced. The others are substantially the same as those of the first embodiment, and the overlapping description is omitted.

(Other Embodiments)

Figure 16:
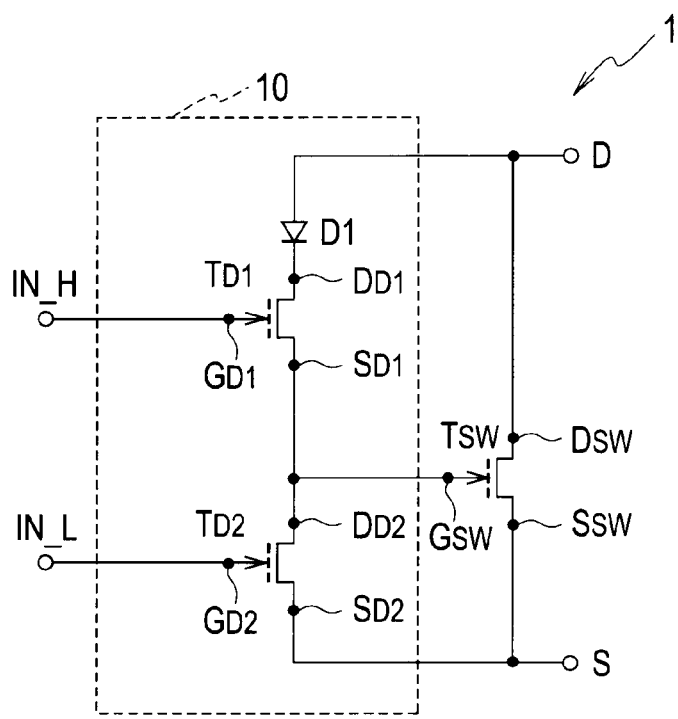
FIG. 16 is a schematic circuit diagram showing the configuration of a switching circuit according to another embodiment of the present invention.

In the description of the first to sixth embodiments described above, the gate electrode $G_{SW}$ of the switching device $T_{SW}$ is connected to the gate resistor R1. However, if the nitride-based FET employed in the switching circuit 1 is a Schottky gate FET, for example, current flows from the gate electrode $G_{D1}$ to the source electrode $S_{D1}$ in the first driving device $T_{D1}$ even when the first driving device $T_{D1}$ is off. Accordingly, when the first driving device $T_{D1}$ is turned off after the switching device $T_{SW}$ is turned on, the switching device $T_{SW}$ is supplied with gate current through the first driving device $T_{D1}$ even if the gate electrode $G_{SW}$ of the switching device $T_{SW}$ is not connected to the gate resistor R1. Accordingly, as shown in FIG. 16, the switching circuit 1 not including the gate resistor R1 connected to the gate electrode $G_{SW}$ of the switching device $T_{SW}$ can be implemented.

Various modifications will become possible for those skilled in the art after receiving the teachings of the present disclosure without departing from the scope thereof.

What is claimed is:

1. A switching circuit comprising:
a switching device including: first and second main electrodes provided with a distance from each other on a principal surface of a nitride semiconductor layer; and a control electrode provided between the first and second main electrodes on the principal surface; and
a driver including:
- a first rectifying device having an anode terminal connected to the first main electrode of the switching device;
- a first driving device having a first main electrode connected to a cathode terminal of the first rectifying device and a second main electrode connected to the control electrode of the switching device;
- a second driving device having a first main electrode connected to the control electrode of the switching device and a second main electrode connected to the second main electrode of the switching device; and
- input terminals receiving control signals inputted to a control electrode of the first driving device and a control electrode of the second driving device.

2. The switching circuit according to claim 1, further comprising a second rectifying device having a cathode terminal connected to the anode terminal of the first rectifying device and an anode terminal connected to the cathode terminal of the first rectifying terminal.

3. The switching circuit according to claim 1, further comprising a protection rectifying device including an anode terminal connected to the second main electrode of the first driving device and a cathode terminal connected to the control electrode of the switching device.

4. The switching circuit according to claim 1, further comprising an inverter circuit outputting to the control electrode of the first driving device, a signal having a phase opposite to the signal inputted to the control electrode of the second driving device.

5. The switching circuit according to claim 1, wherein the switching device and the driver are formed in a same semiconductor chip.

* * * * *